(12) United States Patent
Sato et al.

(10) Patent No.: US 6,310,285 B1
(45) Date of Patent: *Oct. 30, 2001

(54) EMI PREVENTIVE PART AND ACTIVE DEVICE WITH THE SAME

(75) Inventors: Mitsuharu Sato, Yokohama; Koji Kamei, Kawasaki; Shigeyoshi Yoshida, Abiko, all of (JP)

(73) Assignee: Tokin Corporation, Miyagi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/065,030
(22) PCT Filed: Aug. 25, 1997
(86) PCT No.: PCT/JP97/02940
  § 371 Date: Apr. 22, 1998
  § 102(e) Date: Apr. 22, 1998
(87) PCT Pub. No.: WO98/08234
  PCT Pub. Date: Feb. 26, 1998

(30) Foreign Application Priority Data

Aug. 23, 1996 (JP) .................................................. 8-222437

(51) Int. Cl.[7] .................................................. H05K 9/00
(52) U.S. Cl. .................. 174/35 R; 174/35 GC; 174/35 MS; 361/773; 361/776; 361/813; 428/148; 428/143
(58) Field of Search .............................. 174/35 GC, 35 R, 174/35 MS; 361/773, 776, 813; 428/148, 143

(56) References Cited

U.S. PATENT DOCUMENTS 5,508,888 * 4/1996 Craps ..................................... 361/773
5,561,265 * 10/1996 Livshits et al. .................. 174/35 GC
5,789,064 * 8/1998 Valente et al. ........................ 428/148

FOREIGN PATENT DOCUMENTS 0692840  1/1996  (EP) .
0764954  3/1997  (EP) .

* cited by examiner

Primary Examiner—William A. Cuchlinski, Jr.
Assistant Examiner—Ronnie Mancho
(74) Attorney, Agent, or Firm—Hopgood, Calimafde, Judlowe & Mondolino LLP

(57) ABSTRACT

An EMI countermeasure component is provided relative to an active element, which does not deteriorate a circuit function of the active element, but has a sufficient shielding effect against permeation of electromagnetic waves radiated to the exterior, and further suppresses a malfunction or the like due to mutual interferences between peripheral components or an electromagnetic induction to a signal line. The EMI countermeasure component is made of a composite magnetic body including soft magnetic powder having oxide films on the surfaces thereof and an organic binding agent, and extinguishes undesired high frequency electromagnetic radiation as heat due to its complex permeability.

9 Claims, 4 Drawing Sheets

EMI PREVENTIVE PART AND ACTIVE DEVICE WITH THE SAME

TECHNICAL FIELD

The present invention relates to an EMI (electromagnetic interference) countermeasure component and an active element equipped with it and, in particular, to an EMI countermeasure component for suppressing electromagnetic interferences, such as radiation to the exterior, performance degradation and abnormal resonance, caused by undesired electromagnetic waves at a high frequency region, and an active element equipped with it.

BACKGROUND ART

In recent years, there has been a tendency to reduce the in size of electronic devices using high frequency waves, such as digital electronic devices. And, in a digital electronic device having a high mounting density of components on a circuit board, an LSI or IC of a central processing unit (CPU), an image processor logic unit (IPLU) or the like is mounted on the circuit board. The LSI or IC is composed of a large number of semiconductor devices. Since these semiconductor devices carry out operations, such as amplification or oscillation, by receiving the supply of energy from the exterior or external source, they are generally called active elements. And, these active elements often generate inductive noise. Due to the inductive noise, high frequency magnetic fields are induced at the same surface as an element mounting surface of the circuit board and an opposite surface thereof. What is to be a problem here is a phenomenon, such as performance degradation or abnormal resonance, caused by the electrostatic coupling, an increase of the line-line coupling due to the electromagnetic coupling, or an electromagnetic interference due to radiant noise.

Conventionally, against such a so-called electromagentic interference, a measure has been taken, for example, to insert a low-pass filter into a circuit, to dispose a circuit in question at a distance or to carry out shielding, so as to suppress the electromagnetic coupling or the undesired radiant noise which causes the electromagnetic interference.

However, among the conventional measures employed to compensate for electromagnetic interference, is to insert noise filter. However, this method of carrying out the shielding is not too effective because of space requirements for mounting the noise filter. Similarly, the method of positioning the circuit in question at a distance also goes against the realization of the high density. Further, a so-called shielding method, in which a circuit subject to magnetic interference is surrounded by a metal plate or a conductive material formed by conductive plating is a technique which has been used. However, it aims to prevent leakage of the radiant noise generated in the interior to the exterior or invasion of the radiant noise from the exterior to the interior.

If the active element is too close to the semiconductive device, electromagnetic coupling is apt to occur which is undesirable. As a result, in some instances, secondary electromagnetic interference has occurred.

Therefore, an object of the present invention is to provide an EMI countermeasure component which does not adversely affects primary circuit function, but which has sufficient shielding effect against permeation of electromagnetic waves radiated to the exterior, and is further capable of suppressing a malfunction or the like due to mutual interferences between peripheral components or an electromagnetic induction to a signal line, and an active element equipped with it.

DISCLOSURE OF THE INVENTION

According to the invention as disclosed and claimed herein there is provided an EMI countermeasure component for suppressing inductive noise radiated from an active element, such as a semiconductor device, the EMI countermeasure component being characterized by a composite magnetic body essentially consisting of soft magnetic powder having oxide films on surfaces thereof, and an organic binding agent.

According to the invention as described and claimed herein there is provided an EMI countermeasure component as characterized in that the soft magnetic powder having oxide films on the surfaces thereof has a flat shape and/or a needle shape.

According to the invention as further claimed there is obtained an EMI countermeasure component as characterized in that the soft magnetic powder of the flat shape and/or the needle shape is arranged in an orientation in the composite magnetic body.

According to the invention as described and claimed an EMI countermeasure component is provided; characterized by an exposed portion formed to expose a part of a surface of the active element for heat dissipation from the active element.

According to the invention as further claimed there is obtained an active element provided with an EMI countermeasure component, said active element characterized in that one of the EMI countermeasure components is provided at an upper surface of the active element, such as a semiconductor device.

According to the invention as further described and claimed an active element is provided with an EMI countermeasure component, characterized in that one of the EMI countermeasure components is provided at sides of the active element, such as a semiconductor device.

According to the invention as described and claimed herein an active element is provided with an EMI countermeasure component, characterized in that one of the EMI countermeasure components is disposed at a bottom of an active element, such as a semiconductor device.

According to the invention as additionally claimed an active element is provided having an EMI countermeasure component characterized in that the EMI countermeasure component is disposed from the upper surface of the active element to sides thereof so as to surround upper sides of leads connected between the active element and wiring on a board on which the active element is mounted.

The invention further provides an active element having with an EMI countermeasure component characterized in that the EMI countermeasure component is disposed so as to surround leads connecting between the active element and wiring on a board on which the active element is mounted.

The invention further provides there is obtained an EMI countermeasure method characterized in that inductive noise radiated from an active element, such as a semiconductor device, is suppressed by using one of the EMI countermeasure components as described and claimed herein.

Undesired radiant noise generated from an active element, such as a semiconductor device, is largely absorbed/suppressed by means of a composite magnetic body including soft magnetic powder having oxide films on the surfaces thereof and an organic binding agent. Soft magnetic metal as being a conductive substance is ground into powder to obtain the soft magnetic powder, which is then mixed and dispersed within insulating organic binding agent so as to form an insulating film. Particularly, if the shape of the soft magnetic powder is at least one of a flat shape and a needle shape. Accordingly, the undesired radiation components can be efficiently absorbed/suppressed.

By employing a soft magnetic powder which is flat and/or has a needlelike shape, the powder exhibits magnetic anisotropy which is characterized by complex permeability due to magnetic resonance which increases in the high frequency region.

BEST MODE FOR CARRYING OUT THE INVENTION

Hereinbelow, an EMI countermeasure component and an active element equipped with it according to the best mode for carrying out the invention will be described with reference to the drawings.

Figure 1:
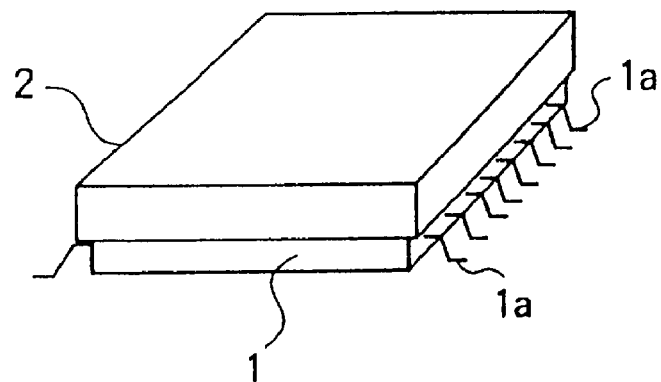
FIG. 1 is a perspective view showing a first embodiment of an LSI equipped with an EMI countermeasure component constituted by a composite magnetic body according to one embodiment of the present invention.

Referring to FIG. 1, a shown active element has an LSI 1. Also shown is an EMI countermeasure component 2 covering the LSI from its upper surface to upper portions of leads (pins) 1a at the sides of the LSI. The EMI countermeasure component 2 comprises a composite magnetic body made of soft magnetic powder having oxide films on the surfaces thereof and an organic binding agent.

Figure 2:
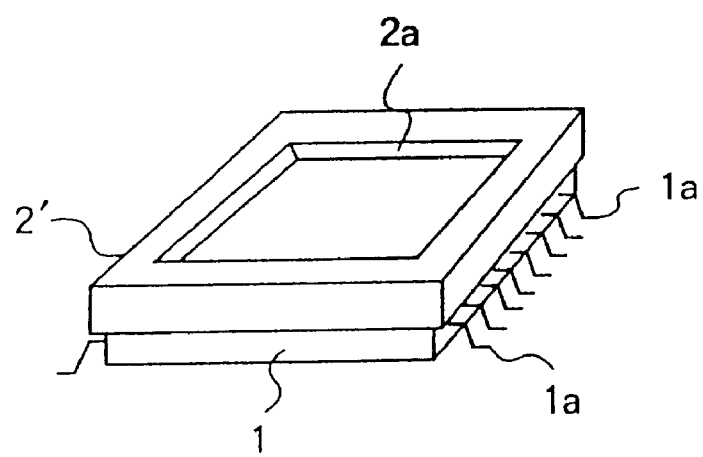
FIG. 2 is a perspective view showing a second embodiment of an LSI equipped with an EMI countermeasure component constituted by a composite magnetic body according to one embodiment of the present invention.

Referring to FIG. 2, a shown active element has an LSI 1. Also shown is an EMI countermeasure component 2' covering the LSI from its upper peripheral edge portion to upper portions of leads (pins) 1a at the sides of the LSI. The EMI countermeasure component 2' comprises a composite magnetic body made of soft magnetic powder having oxide films on the surfaces thereof and an organic binding agent.

As different from the EMI countermeasure component 2 of FIG. 1, the EMI countermeasure component 2' disposed on the upper surface of the LSI 1 has a cutout 2a at a portion thereof. This causes a part of the surface of the LSI 1 to be exposed, so that the inductive radiant noise can be suppressed without deteriorating a heat dissipation.

Figure 3:
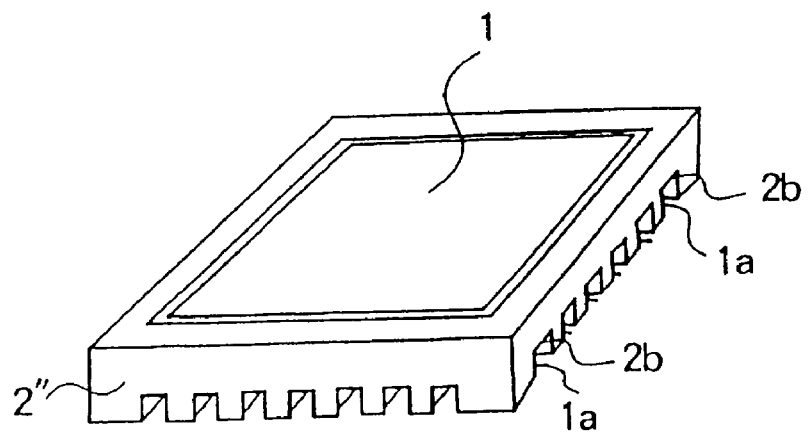
FIG. 3 is a perspective view showing a third embodiment of an LSI equipped with an EMI countermeasure component constituted by a composite magnetic body according to one embodiment of the present invention.

Referring to FIG. 3, a shown active element has an LSI 1. Also shown is an EMI countermeasure component 2" disposed so as to surround leads (pins) 1a at the sides of the LSI. The EMI countermeasure component 2" is also constituted by a composite magnetic body made of soft magnetic powder having oxide films on the surfaces thereof and an organic binding agent. In this case, with respect to the EMI countermeasure component 2' in FIG. 2, the EMI countermeasure component 2" has a structure in which windows 2b for taking out the leads 1a of the LSI 1 are formed at intervals allowing non-contact states relative to the leads 1a. Since the surface resistance of the composite magnetic body is high, i.e. $10^6$–$10^8 \Omega$, it can be formed integral with the LSI 1.

When the EMI countermeasure component 2, 2', 2" is provided as described above, the magnetic flux in high frequency magnetic fields generated from the back of the LSI 1 and the leads (pins) 1a thereof is subjected to thermal conversion due to an imaginary part permeability $\mu''$ of the composite magnetic body forming each EMI countermeasure component and ceased. As a result, the inductive coupling between the LSI 1, and a printed board on which the LSI 1 is mounted and peripheral components such as passive components, is weakened so that the undesired electromagnetic waves can be efficiently suppressed.

Figure 4:
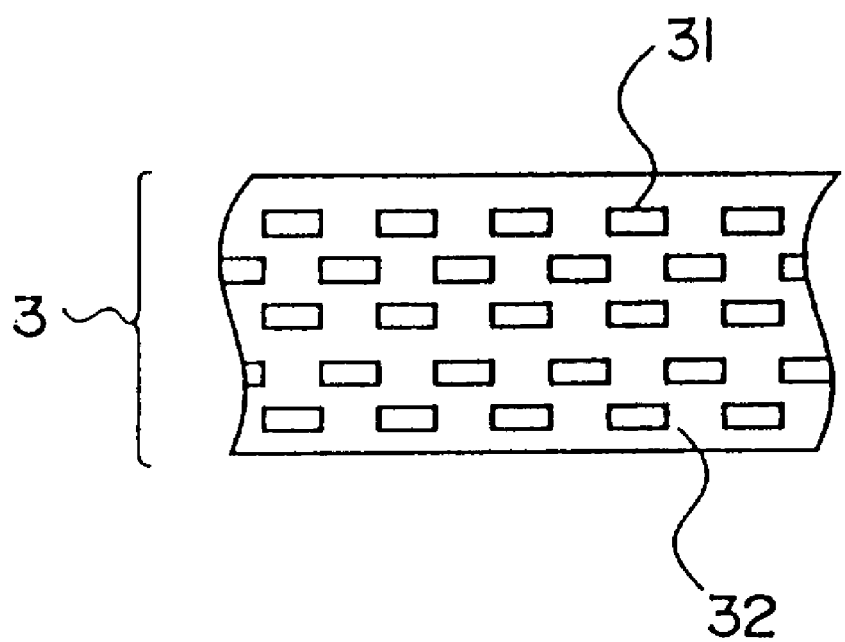
FIG. 4 is an enlarged partial sectional view of the composite magnetic body constituting the EMI countermeasure component shown in FIG. 1, 2 or 3.

Now, a composite magnetic body 3 forming the foregoing EMI countermeasure component 2, 2', 2" will be explained with reference to FIG. 4. The composite magnetic body 3 is in the form of soft magnetic powder 31 having oxide films on the surfaces thereof and bound by an organic binding agent 32. Specifically, the soft magnetic powder 31 is uniformly dispersed in the organic binding agent 32. Here, the soft magnetic powder 31 has a flat shape or/and a needle shape.

For the soft magnetic powder 31 of the flat shape (or the needle shape), Fe—Al—Si alloy (Sendust) or Fe—Ni alloy (Permalloy) having a large high frequency permeability can be employed. It is preferable that an aspect ratio of the soft magnetic powder 3 is sufficiently large (approximately not less than 5:1).

For the organic binding agent 32, thermoplastic resin, such as polyester resin, polyvinyl chloride resin, polyvinyl butyral resin, polyurethane resin, cellulose resin, nitrile-butadiene rubber or stylene-butadiene rubber, or copolymers thereof, or thermosetting resin, such as epoxy resin, phenol resin, amide resin or imide resin, can be cited.

A thickness, a constituent material and the like of the composite magnetic body 3 are determined so as to realize the optimum electromagnetic environment in consideration of a using state of the active element, an electromagnetic field strength and the like.

For verifying the effect of the EMI countermeasure component and the LSI equipped therewith according to the foregoing embodiment with respect to the electromagnetic interference, soft magnetic paste of a combination shown in Table 1 below was prepared, then formed into a film by a doctor blade process and, after applied with hot-pressing, subjected to curing at 85° C. for 24 hours, so that a first sample with a thickness of 1 mm was prepared and its characteristics were evaluated.

The obtained first sample was analyzed using a vibrating magnetometer and a scanning electron microscope and it was found that the directions of easy magnetization axis and magnetic particle orientation are both in the surface of the layer. Further, the surface resistance was measured and found to be $4 \times 10^7 \Omega$.

TABLE 1

| | |
|---|---|
| Flat soft magnetic fine powder | 90 weight parts |
| Composition: Fe—Al—Si alloy | |
| Average particle diameter: 10 μm | |
| Aspect ratio: >5 | |
| Organic binding agent | |
| Polyurethane resin | 8 weight parts |
| Hardening agent | |
| (Isocyanate compound) | 2 weight parts |
| Solvent | |
| Compound of cyclohexanone and toluene | 40 weight parts |
| Ethyl cellosolve | 65 weight parts |

A composite magnetic body, the foregoing first sample, was formed into a shape of each of the EMI countermeasure components 2, 2' and 2" shown in FIGS. 1, 2 and 3 and mounted on the LSI. Then, the LSI is operated using a test circuit and the strength of an electromagnetic field above the LSI was measured by a spectrum analyzer, thereby to confirm the effect.

On the other hand, the measurement was also carried out under the same conditions as the foregoing about the state where the EMI countermeasure component was not mounted.

Figure 5:
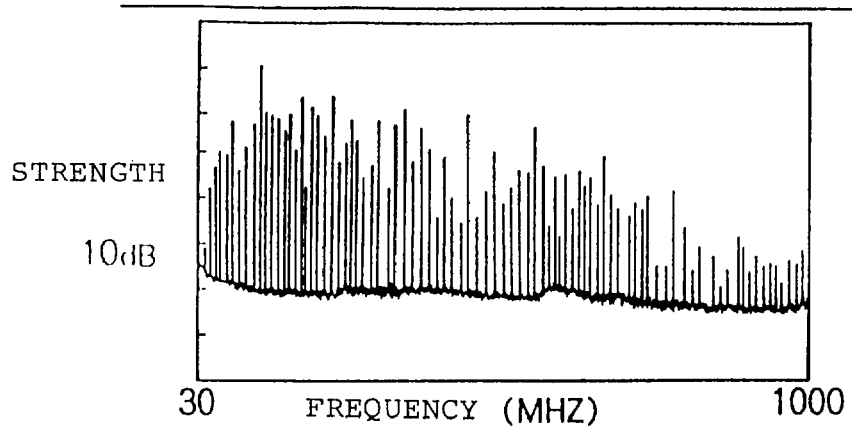
FIG. 5 is a diagram showing a frequency characteristic of the strength of an electromagnetic field at an upper side of an LSI (active element) with no composite magnetic body mounted thereon.
Figure 6:
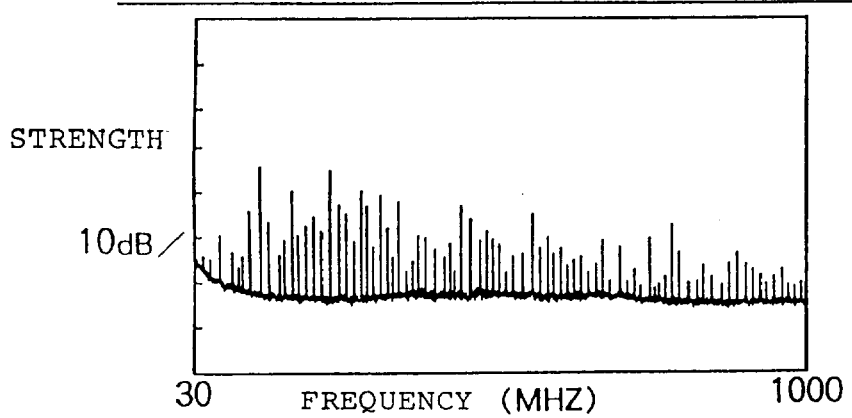
FIG. 6 is a diagram showing a frequency characteristic of the strength of an electromagnetic field at an upper side of an LSI (active element) mounted with the EMI countermeasure component as shown in FIG. 1.
Figure 7:
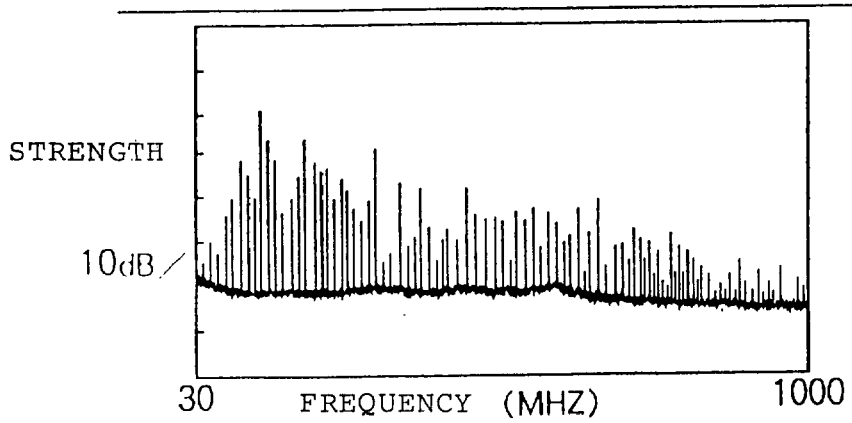
FIG. 7 is a diagram showing a frequency characteristic of the strength of an electromagnetic field at an upper side of an LSI (active element) mounted with the EMI countermeasure component as shown in FIG. 2.

The measurement results are shown in FIGS. 5, 6 and 7. FIG. 5 shows a frequency characteristic of the strength of the electromagnetic field above the LSI with no EMI countermeasure component mounted thereon. FIG. 6 shows a frequency characteristic of the strength of the electromagnetic field above the LSI mounted with the EMI countermeasure component 2 shown in FIG. 1. FIG. 7 shows a frequency characteristic of the strength of the electromagnetic field above the LSI mounted with the EMI countermeasure component 2' shown in FIG. 2. Measurement positions in FIGS. 6 and 7 are both the same as that in FIG. 5.

From the foregoing results, it is understood that the radiant noise from the LSI mounted with the EMI countermeasure components is largely attenuated.

Figure 8:
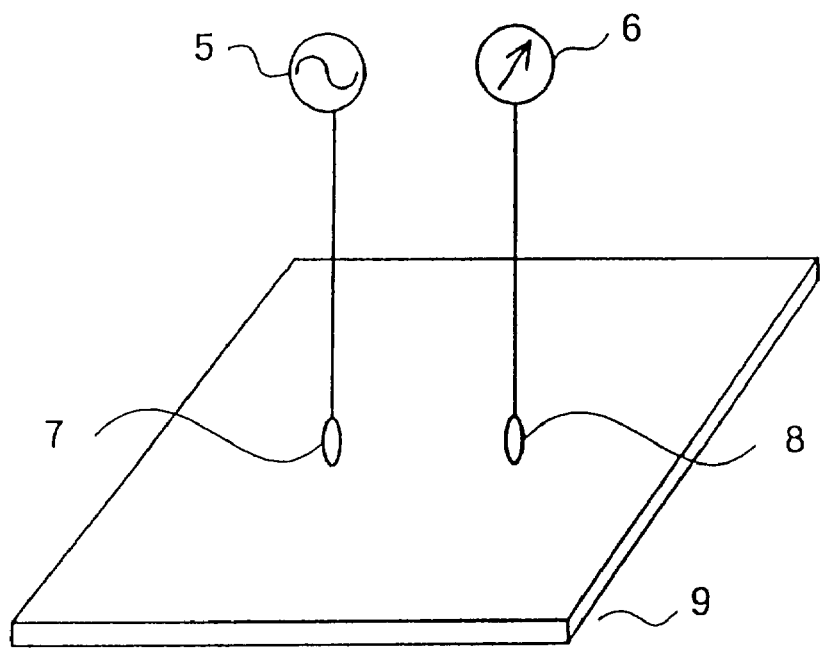
FIG. 8 is a diagram for explaining a measuring method for verifying characteristics of a composite magnetic body constituting an EMI countermeasure component, and is a schematic diagram showing an evaluating system for coupling levels.

Further, an electromagnetic coupling level of the foregoing composite magnetic body of the first sample was measured in a test apparatus shown in FIG. 8. For a comparative sample, a copper foil of 35 μm was used as a second sample.

In the test apparatus, an electromagnetic field transmitting fine loop antenna 7 and an electromagnetic field receiving fine loop antenna 8 each having a loop diameter of not greater than 2 mm are connected to an electromagnetic wave generator 5 and an electromagnetic field strength measuring device (reception element) 6, respectively. Measurement was carried out by disposing the electromagnetic field transmitting fine loop antenna 7 and the electromagnetic field receiving fine loop antenna 8 to confront each other at one side of the first or second sample 9. To the electromagnetic field strength measuring device 6 is connected a non-shown spectrum analyzer. For measurement values, an electromagnetic field strength in the state where no sample was present was used as a reference.

Figure 9:
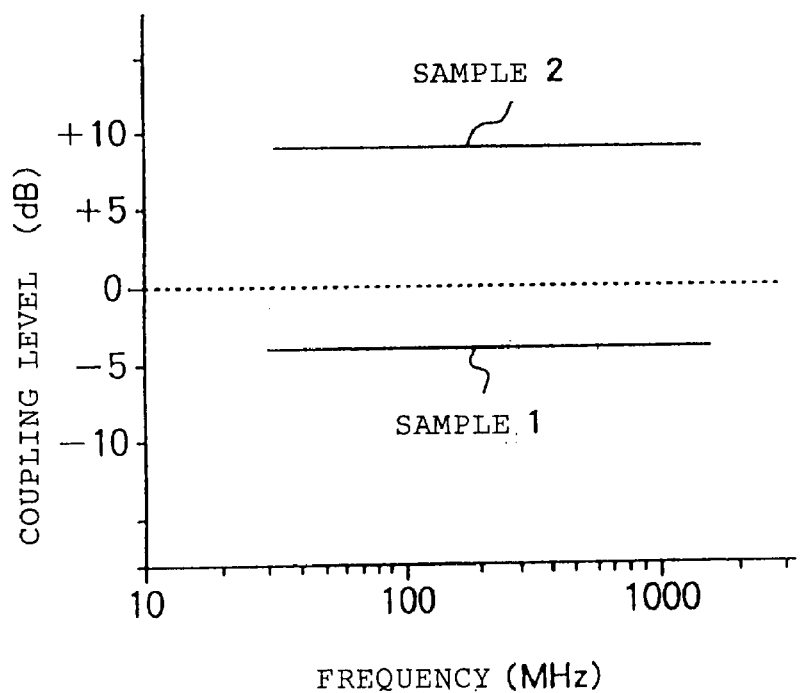
FIG. 9 is a graph showing the results of measurement of the characteristics using the evaluating system of FIG. 8, and is a frequency characteristic diagram of the coupling levels.

The results of the measurement in FIG. 8 are shown in FIG. 9.

As compared with the second sample (copper foil of 35 μm), an increase of the electromagnetic coupling level is not observed in the first sample being the composite magnetic body made of the soft magnetic powder having the oxide films on the surfaces thereof and the organic binding agent.

As described above, the inductive noise radiated from the active element such as the semiconductor device can be effectively suppressed by mounting the EMI countermeasure component constituted by the composite magnetic body made of the soft magnetic powder having the oxide films on the surfaces thereof and the organic binding agent.

INDUSTRIAL APPLICABILITY

As described above, by mounting the EMI countermeasure component constituted by the composite magnetic body of the present invention onto the active element such as the semiconductor device, the mutual interference caused by the electromagnetic induction and the undesired electromagnetic waves can be effectively suppressed. Further, since the mounting space is not required, the size reduction can be accomplished. Thus, it is very effective for the EMI countermeasure in high frequency devices, such as mobile communication devices.

What is claimed is:

1. An EMI countermeasure cover arranged to cover an electric active element for suppressing inductive noise radiated from the active element such as a semiconductor device, said EMI countermeasure cover being made of a composite magnetic body comprising soft magnetic metal powder particles and an organic binding agent binding said soft magnetic metal powder particles to one another, wherein each of said soft magnetic metal powder particles has a surface oxide film and has a flat shape and/or a needle shape.

2. An EMI countermeasure cover as recited in claim 1, wherein said soft magnetic metal powder articles of flat and/or needle shape are directionally oriented in said composite magnetic body.

3. An EMI countermeasure cover as recited in claim 1, wherein said cover has a window formed therein to expose a part of a surface of said active element for allowing heat dissipation from said active element.

4. An active element with an EMI countermeasure cover for suppressing inductive noise radiated from said active element, such as a semiconductor device, said EMI countermeasure cover being made of a composite magnetic body comprising soft magnetic metal powder particles dispersed through an organic binding agent which binds said soft magnetic metal powder particles one to another, wherein each of said soft magnetic metal powder particles has a surface oxide film and has a flat shape and/or a needle shape.

5. An active element with an EMI countermeasure cover as claimed in claim 4, said EMI countermeasure cover being disposed on an upper surface of the active element.

6. An active element with an EMI countermeasure cover as claimed in claim 4, said EMI countermeasure cover being disposed along sides of said active element.

7. An active element with an EMI countermeasure cover as claimed in claim 6, said EMI countermeasure cover being disposed so as to surround sides of leads connected between said active element including wiring on a board on which said active element is mounted.

8. An active element with an EMI countermeasure cover as claimed in claim 4, said EMI countermeasure cover being disposed to extend from an upper surface of said active element to sides thereof so as to surround upper sides of leads connected between said active element and wiring on a board on which said active element is mounted.

9. An active element as claimed in any one of claims 5 or 8, wherein said EMI countermeasure cover has a window through which said upper surface of the active element is partially exposed.

* * * * *